(12) United States Patent
Chang et al.

(10) Patent No.: US 8,623,182 B2
(45) Date of Patent: Jan. 7, 2014

(54) CONTINUOUS VACUUM DEPOSITION METHOD

(75) Inventors: Hsin-Pei Chang, Tu-Cheng (TW);
Wen-Rong Chen, Tu-Cheng (TW);
Huann-Wu Chiang, Tu-Cheng (TW);
Lone-Wen Tai, Tu-Cheng (TW);
Cheng-Shi Chen, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 319 days.

(21) Appl. No.: 13/097,207

(22) Filed: Apr. 29, 2011

(65) Prior Publication Data
US 2012/0018296 A1    Jan. 26, 2012

(30) Foreign Application Priority Data
Jul. 23, 2010  (CN) .......................... 2010 1 0234736

(51) Int. Cl.
*C23C 14/34* (2006.01)

(52) U.S. Cl.
USPC ................................ 204/192.38; 204/298.41

(58) Field of Classification Search
USPC ........................ 204/298.41, 192.38
See application file for complete search history.

(56) References Cited

U.S. PATENT DOCUMENTS

| | | | | |
|---|---|---|---|---|
| 3,294,670 | A | * | 12/1966 | Charschan et al. ...... 204/298.25 |
| 4,929,322 | A | * | 5/1990 | Sue et al. ................. 204/192.38 |
| 5,380,420 | A | * | 1/1995 | Tsuji ........................ 204/298.41 |
| 2002/0102400 | A1 | * | 8/2002 | Gorokhovsky et al. ....... 428/336 |

* cited by examiner

*Primary Examiner* — Rodney McDonald
(74) *Attorney, Agent, or Firm* — Altis Law Group, Inc.

(57) ABSTRACT

A continuous vacuum sputtering method includes the steps of providing a substrate; providing a continuous vacuum sputtering machine comprising a depositing chamber. The depositing chamber comprising at least one vacuum chamber, each vacuum chamber having a cathodic arc emitting source located therein; the substrate being loaded in the continuous vacuum sputtering machine; depositing a coating on the substrate by cathodic arc deposition using the cathodic arc emitting source.

6 Claims, 1 Drawing Sheet

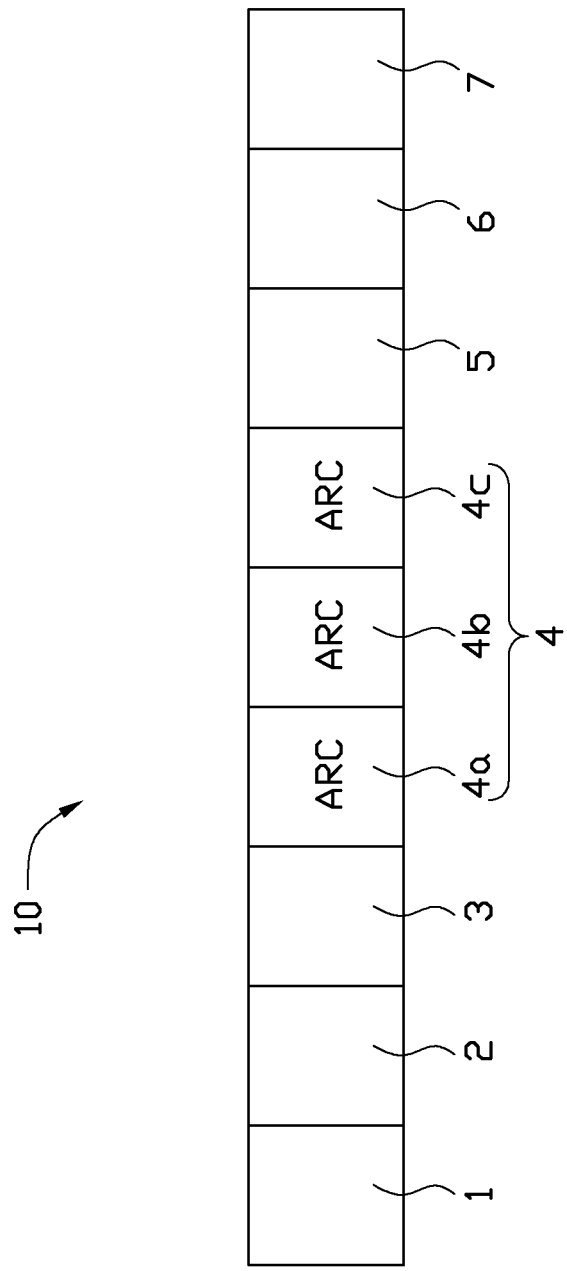

CONTINUOUS VACUUM DEPOSITION METHOD

BACKGROUND

1. Technical Field

The exemplary disclosure generally relates to a continuous vacuum deposition method.

2. Description of Related Art

Continuous vacuum deposition machines are used for continuously applying more than one coating to a substrate without stopping the operation of the machine and opening a chamber of the machine so that the target inside the chamber can be changed. Additionally, the process for depositing the coating on the substrate, in a typical continuous vacuum deposition machine, is evaporation or sputtering. However, the rate of depositing coating by evaporation or sputtering and the binding force between the coating and the substrate are both low.

Therefore, there is chamber for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary continuous vacuum deposition method. Moreover, in the drawings like reference numerals designate corresponding parts throughout the several views. Wherever possible, the same reference numbers are used throughout the drawings to refer to the same or like elements of an embodiment.

The FIGURE is a schematic view of a continuous vacuum deposition machine used in an exemplary embodiment of continuous vacuum deposition method.

DETAILED DESCRIPTION

Referring the FIGURE, an exemplary embodiment of continuous vacuum deposition method may include at least the following steps.

Providing a substrate. The substrate may be made of metal, glass or ceramic.

Providing a continuous vacuum deposition machine 10. The continuous vacuum deposition machine 10 includes a loading chamber 1, a first pumping chamber 2, a first buffering chamber 3, a depositing chamber 4, a second buffering chamber 5, a second pumping chamber 6, and an unloading chamber 7, all in series. The depositing chamber 4 may include a single vacuum chamber or a plurality of vacuum chambers connected in series. In this exemplary embodiment, the depositing chamber 4 includes a series arrangement of three vacuum chambers 4a, 4b, and 4c. Each of the vacuum chambers 4a, 4b, and 4c has a cathodic arc emitting source located therein.

Depositing a coating on the substrate by a cathodic arc deposition (Arc-PVD) method. The loading chamber 1 is opened to load the substrate in the loading chamber 1, and then the loading chamber 1 is closed. The first pumping chamber 2 is opened. The substrate is transferred to the first pumping chamber 2. The first pumping chamber 2 is closed so the air can be pumped out until to a predetermined pressure is acquired. The first buffering chamber 3 is opened. The substrate is transferred to the first buffering chamber 3. The first buffering chamber 3 is closed to separate the first pumping chamber 2 and the depositing chamber 4, i.e., the first buffering chamber 3 acts as a barrier between the first pumping chamber 2 and the depositing chamber 4 to prevent the air inside the first pumping chamber 2 from entering into the depositing chamber 4. The substrate is successively entered into the vacuum chambers 4a, 4b, 4c to deposit the coating on the substrate. For simplicity, the means for moving the substrate through the various chambers is not shown. The coating may include a bonding layer, a protection layer and a color layer successively deposited on the substrate. The bonding layer may be a zirconium layer deposited in the vacuum chamber 4a. The protection layer may be a zirconium carbon-oxide layer deposited in the vacuum chamber 4b. The color layer may be a titanium nitride-carbon layer deposited in the vacuum chamber 4c.

During depositing the bonding layer on the substrate, the temperature in the vacuum chamber 4a is set between about 130 degrees Celsius (° C.) and about 170° C. Pure argon is floated into the vacuum chamber 4a at a flux between about 450 Standard Cubic Centimeters per Minute (sccm) and about 550 sccm. A zirconium target in the vacuum chamber 4a is evaporated at a power between about 100 amps and about 500 amps, for between about 1 minute and about 2 minutes, to deposit the bonding layer on the substrate.

During depositing the protection layer on the substrate, the temperature in the vacuum chamber 4b is set between about 130° C. and about 170° C. Simultaneously, pure argon is fed into the vacuum chamber 4b at a flux between about 450 sccm and about 550 sccm, Oxygen is floated into the vacuum chamber 4b at a flux between about 45 sccm and about 55 sccm, and Acetylene is floated into the vacuum chamber 4b at a flux between about 95 sccm and about 105 sccm. A zirconium target in the vacuum chamber 4b is evaporated at a power between about 100 amps and about 500 amps, for between about 1 minute and about 2 minutes, to deposit the protection layer on the substrate.

During the depositing of the protection layer on the substrate, the temperature in the vacuum chamber 4c is set between about 130° C. and about 170° C. Simultaneously, pure argon is floated into the vacuum chamber 4c at a flux between about 450 sccm and about 550 sccm, Nitrogen is floated into the vacuum chamber 4c at a flux between about 45 sccm and about 55 sccm, and Acetylene is floated into the vacuum chamber 4c at a flux between about 95 sccm and about 105 sccm. A titanium target in the vacuum chamber 4c is evaporated at a power between about 100 amps and about 500 amps, for between about 1 minute and about 2 minutes, to deposit the color layer on the substrate.

After the coating is deposited, the second buffering chamber 5 is opened. The substrate having the coating is transferred to the second buffering chamber 5. The second buffering chamber 5 is closed to separate the second pumping chamber 6 and the depositing chamber 4, i.e., the second buffering chamber 5 acts as a barrier between the second pumping chamber 6 and the depositing chamber 4 to prevent the air inside the second pumping chamber 6 from entering into the depositing chamber 4. The second pumping chamber 6 is opened, and the substrate having the coating is transferred to the second pumping chamber 6. The second pumping chamber 6 is closed so air can be pumped into the first pumping chamber 2 until reaching a predetermined pressure. The unloading chamber 7 is opened, and the substrate having the coating is transferred to the unloading chamber 7 for removal out of the continuous vacuum sputtering machine 10.

In the above exemplary embodiment, the coating is deposited on the substrate by cathodic arc deposition so the rate of depositing the coating can be increased, and the binding force between the coating and the substrate can be improved.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A continuous vacuum deposition method, comprising:
providing a substrate;
providing a continuous vacuum deposition machine comprising a depositing chamber, the depositing chamber comprising a series arrangement of a first vacuum chamber, a second vacuum chamber and a third vacuum chamber, each vacuum chamber having a cathodic arc emitting source located therein;
loading the substrate in the continuous vacuum deposition machine; and
depositing a coating on the substrate by cathodic arc deposition using the cathodic arc emitting source,
depositing the coating comprising:
directly depositing a bonding layer on the substrate in the first vacuum chamber, the bonding layer being a zirconium layer;
directly depositing a protection layer on the bonding layer in the second vacuum chamber, the protection layer being a zirconium carbon-oxide layer;
directly depositing a color layer on the protection layer in the third vacuum chamber, the color layer being a titanium nitride-carbon layer.

2. The method as claimed in claim 1, wherein the substrate is made of metal, glass or ceramic.

3. The method as claimed in claim 1, wherein the continuous vacuum deposition machine further comprises a loading chamber, a first pumping chamber, a first buffering chamber, a second buffering chamber, a second pumping chamber and a unloading chamber, all in series and the depositing chamber located between the first buffering chamber and second buffering chamber.

4. The method as claimed in claim 1, wherein during depositing the bonding layer on the substrate, the temperature in the first vacuum chamber is set between about 130° C. and about 170° C.; pure argon is floated into the first vacuum chamber at a flux between about 450 sccm and about 550 sccm; a zirconium target in the first vacuum chamber is evaporated at a power between about 100 amps and about 500 amps, for between about 1 minute and about 2 minutes, to deposit the bonding layer on the substrate.

5. The method as claimed in claim 1, wherein during depositing the protection layer on the substrate, the temperature in the second vacuum chamber is set between about 130° C. and about 170° C.; simultaneously, pure argon is fed into the second vacuum chamber at a flux between about 450 sccm and about 550 sccm, oxygen is floated into the second vacuum chamber at a flux between about 45 sccm and about 55 sccm; and acetylene is floated into the second vacuum chamber at a flux between about 95 sccm and about 105 sccm; a zirconium target in the second vacuum chamber is evaporated at a power between about 100 amps and about 500 amps, for between about 1 minute and about 2 minutes, to deposit the protection layer on the substrate.

6. The method as claimed in claim 1, wherein during depositing the protection layer on the substrate, the temperature in the third vacuum chamber is set between about 130° C. and about 170° C.; simultaneously, pure argon is fed into the third vacuum chamber at a flux between about 450 sccm and about 550 seem; nitrogen is floated into the third vacuum chamber at a flux between about 45 sccm and about 55 sccm; and acetylene is floated into the third vacuum chamber at a flux between about 95 sccm and about 105 sccm; a titanium target in the third vacuum chamber is evaporated at a power between about 100 amps and about 500 amps, for between about 1 minute and about 2 minutes, to deposit the color layer on the substrate.

* * * * *